(12) United States Patent
Bertin et al.

(10) Patent No.: US 6,455,778 B2
(45) Date of Patent: Sep. 24, 2002

(54) MICRO-FLEX TECHNOLOGY IN SEMICONDUCTOR PACKAGES

(75) Inventors: Claude Louis Bertin, South Burlington, VT (US); Thomas George Ference, Essex Junction, VT (US); Wayne John Howell, Williston, VT (US); John Atkinson Fifield, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/894,692

(22) Filed: Jun. 28, 2001

Related U.S. Application Data

(62) Division of application No. 09/105,382, filed on Jun. 26, 1998, now Pat. No. 6,300,687.

(51) Int. Cl.[7] .............................................. H01L 33/00
(52) U.S. Cl. ................................ 174/88 R; 174/117 F; 174/113 R
(58) Field of Search ............................... 174/268, 71 R, 174/72 R, 113 R, 27, 114 R, 88 R, 117 F

(56) References Cited

U.S. PATENT DOCUMENTS

| | | | |
|---|---|---|---|
| 3,978,516 A | | 8/1976 | Noe |
| 4,160,274 A | | 7/1979 | Stephenson, Jr. et al. |
| 4,890,157 A | | 12/1989 | Wilson |
| 5,196,725 A | | 3/1993 | Mita et al. |
| 5,221,858 A | | 6/1993 | Higgins, III |
| 5,245,215 A | | 9/1993 | Sawaya |
| 5,283,390 A | * | 2/1994 | Hubis et al. |
| 5,362,257 A | | 11/1994 | Neal et al. |
| 5,365,409 A | | 11/1994 | Kwon et al. |
| 5,386,141 A | | 1/1995 | Liang et al. |
| 5,488,257 A | | 1/1996 | Bhattacharyya et al. |
| RE35,353 E | | 10/1996 | Tokita et al. |
| 5,606,199 A | | 2/1997 | Yoshigai |
| 6,043,557 A | | 3/2000 | Phelps, Jr. et al. |
| 6,153,929 A | | 11/2000 | Moden et al. |
| 6,231,919 B1 | * | 5/2001 | Craton |
| 6,254,924 B1 | * | 7/2001 | Brorein et al. |
| 6,323,427 B1 | * | 11/2001 | Rutledge |

OTHER PUBLICATIONS

IBM Technical Disclosure Bulletin, vol. 25 No. 10, Mar. 1983, Chip–on–Chip Module for Assembly, Spector et al., 5315–5310.

IBM Technical Disclosure Bulletin, vol. 36, No. 12, Dec. 1993, Optical Flex Interconnect to Multi–Chip Modules, 669.

IBM Technical Disclosure Bulletin, vol. 36 No. 12, Dec. 1993, Flex Interconnect of Multi–Chip Modules, 463–464.

IBM Technical Disclosure Bulletin, vol. 36, No. 12, Dec. 1993, Enhanced I/O Capability for Silicon on Silicon Using Solder Columns, 75–76.

IBM Technical Disclosure Bulletin, vol. 26, No. 9, Feb. 1984: Interposer for Chip–on–Chip Module Attachment; I. Feinbert et al., pp. 4590–4591.

Novel Uses of Flexible Circuit Technology in High Performance Electronic Applications, DiStefano et al., Microelectronics International No. 39, Jan. 1996, pp. 11–15.

* cited by examiner

*Primary Examiner*—Sheila V. Clark
(74) *Attorney, Agent, or Firm*—Schmeiser, Olsen & Watts; Howard J. Walter, Jr.

(57) ABSTRACT

Thin-film microflex twisted-wire pair and other connectors are disclosed. Semiconductor packages include microflex technology that electrically connects at least one chip to another level of packaging. Microflex connectors, such as thin-film twisted-wire pair connectors according to the present invention provide superior electrical performance, which includes reduced line inductance, incorporation of integrated passive components, and attachment of discrete passive and active components to the microflex. All of these features enable operation of the chip at increased frequencies.

2 Claims, 12 Drawing Sheets

US 6,455,778 B2

MICRO-FLEX TECHNOLOGY IN SEMICONDUCTOR PACKAGES

RELATED APPLICATIONS

This application is a divisional of Ser. No. 09/105,382, filed on Jun. 26, 1998, now U.S. Pat. No. 6,300,687.

This application is related to U.S. Ser. No. 09/105,419, now U.S. Pat. No. 5,977,640, entitled "Highly Integrated Chip-on-Chip Packaging", by Bertin et al; and U.S. Ser. No. 09/105,477, now U.S. Pat. No. 6,225,699, entitled "Chip-on-Chip Interconnections of Varied Characteristics", by Ference et al. The related patents are assigned to the assignee of record, were filed concurrently herewith, and are herein incorporated by reference.

BACKGROUND OF THE INVENTION

1. Technical Field

The invention relates generally to semiconductor devices, and more specifically, to packaging in semiconductor devices.

2. Background Art

In a conventional semiconductor integrated-circuit package, electrical connections to the bonding pads of a chip may be provided through a thin metal leadframe, which is typically stamped or chemically etched from strips of copper-containing materials. The leadframe includes a number of thin, closely-spaced conductive inner leads that radially extend away from the edges of the chip. The inner leads diverge away from the chip and extend through the exterior walls of the molded package where they form the external I/O leads for the package.

Some examples of conventional semiconductor integrated-circuit packages are found in the following U.S. Patents: U.S. Pat. No. 3,978,516, "Lead Frame Assembly for a Packaged Semiconductor Microcircuit" issued August 1976 to Noe; U.S. Pat. No. Re. 35,353, "Process for Manufacturing a Multi-Level Lead Frame" issued October 1996 to Tokita et al. ; and U.S. Pat. No. 5,365,409, "Integrated Circuit Package Design Having an Intermediate Die-Attach Substrate Bonded to a Leadframe" issued November 1994 to Kwon et al. In the aforementioned patents, thin-film and thick-film material is used to form unique inner leads to increase speed and/or flexibility of conventional semiconductor packages.

One problem, though, with conventional semiconductor packages is that the current lead lengths are too inductive for the increased speed of operations of DRAMs. As chip sizes are reduced, the length of the lead frame segment to package edge increases, further increasing inductance. This excessive lead inductance results in degraded electrical performance of the package. Furthermore, the chip I/O pitch is limited because of the leadframe fabrication capabilities and package stresses are created when large chips are mechanically coupled to the leadframe inside a plastic encapsulated package.

SUMMARY OF THE INVENTION

It is thus an advantage of the present invention to provide thin-film connectors, such as thin-film twisted-wire pairs that eliminate the above-described and other limitations.

The advantages of the invention are realized by thin-film microflex connectors, such as thin-film microflex twisted-wire pair connectors, that electrically connect at least one chip to another level of packaging. Thus, microflex connectors according to the present invention provide superior electrical performance, which includes reduced line inductance, incorporation of integrated passive components, and attachment of discrete passive and active components to the microflex. All of these features enable operation of a chip at increased frequencies.

The foregoing and other advantages and features of the invention will be apparent from the following more particular description of preferred embodiments of the invention, as illustrated in the accompanying drawings.

BRIEF DESCRIPTION OF THE DRAWINGS

The preferred exemplary embodiments of the present invention will hereinafter be described in conjunction with the appended drawings, where like designations denote like elements, and.

DETAILED DESCRIPTION OF THE DRAWINGS

Figure 1:
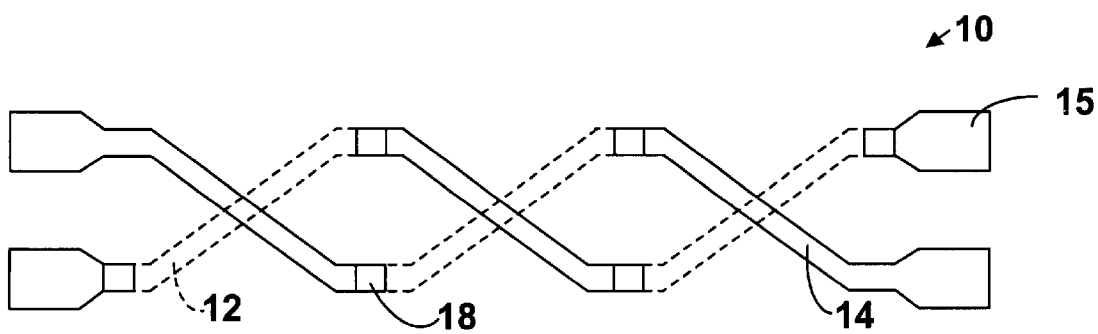
FIG. 1 is a plan view showing a thin-film wiring configured into a twisted-wire pair in accordance with a preferred embodiment of the present invention.
Figure 2:
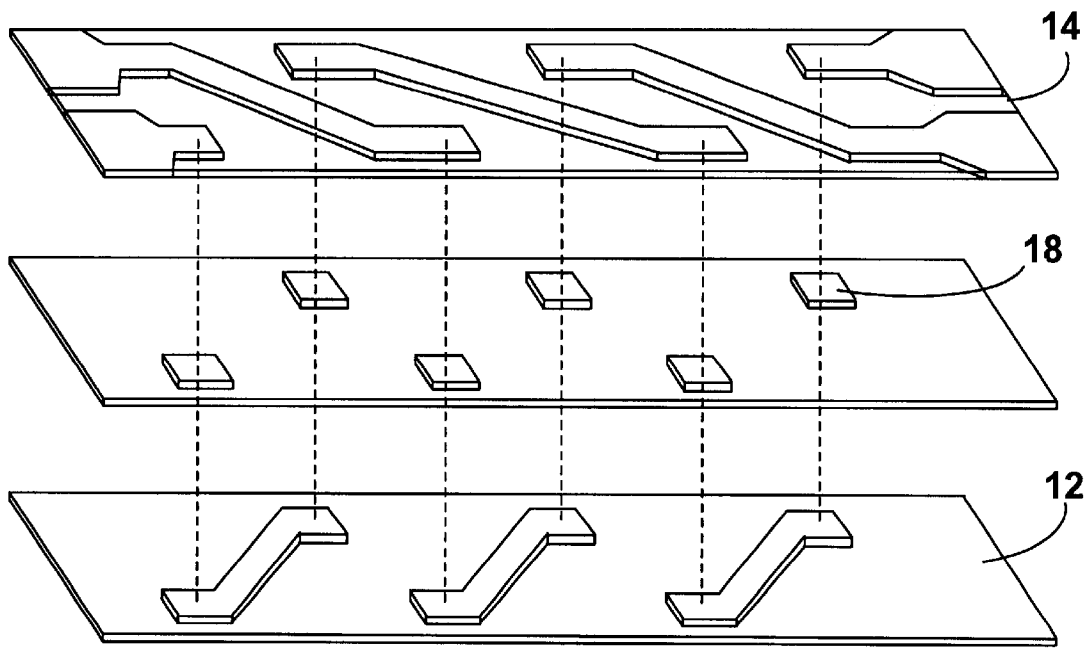
FIG. 2 is an exploded view of FIG. 1 including the thin-film layers.
Figure 3:
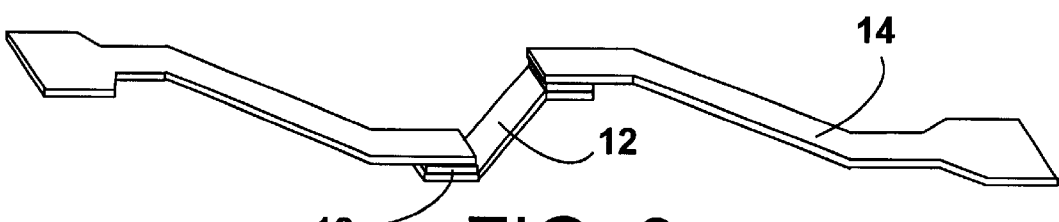
FIG. 3 is a top perspective view of one of the thin-film wiring of FIG. 1.

Referring to FIG. 1, a microflex thin-film twisted-wire pair 10 in accordance with a preferred embodiment of the present invention is shown. The twisted-wire pair 10 comprises termination pad 15, thin-film wire having a middle portion and end portions made from a top layer of thin-film 14, a thin-film wire having a middle portion and end portions made from a bottom layer of thin-film 12 and vias, or studs 18, in an interconnection layer of thin-film connecting the end portions of the top layer thin-film wire 14 to the end portions of the bottom layer thin-film wire 12, wherein the middle portions of the top and bottom layer cross each other. FIG. 2 illustrates each of the layers—top 14, interconnection 18 and bottom 12, with the respective thin-film wiring. FIG. 3 then shows one completed wire fabricated from the top layer 14, interconnection layer 18 and bottom layer 12 of thin-film, extending from termination pad to termination pad. Although the twisted-wire pair is the preferred embodiment of this invention, it is to be understood that other wiring and/or elements may also be made from the microflex thin-film, such as a single wire, capacitors, resistors, etc., which will be discussed in reference to FIGS. 9–13 below. The microflex connectors greatly enhance electrical performance and compactability in semiconductor packaging. As will be seen in subsequent examples, replacing long inner leads with a microflex twisted-pair wire in semiconductor leadframe packaging reduces the inner-lead inductance, thus enhancing the electrical performance, and reduces package stresses since the chip connects mechanically to a more compliant material. This enables new product applications for larger, higher I/O and more electrically-enhanced chips.

Figure 4:
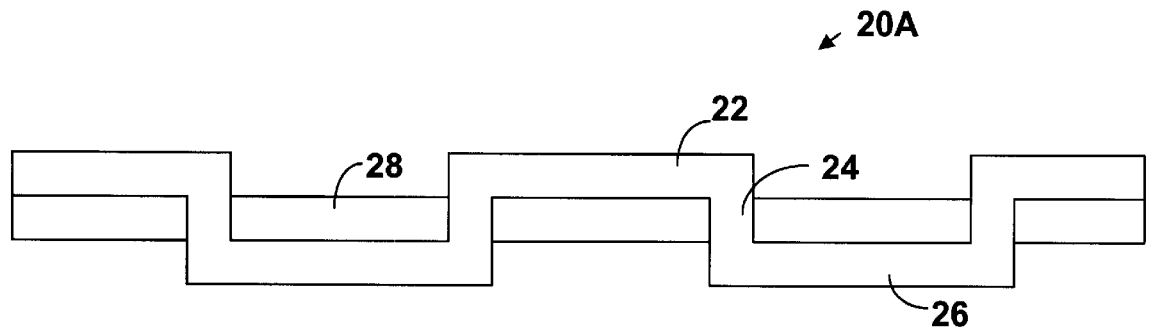
FIGS. 4, 5 and 6 are cross-sectional views showing exemplary embodiments of the twisted-wire pair of FIG. 1.
Figure 5:
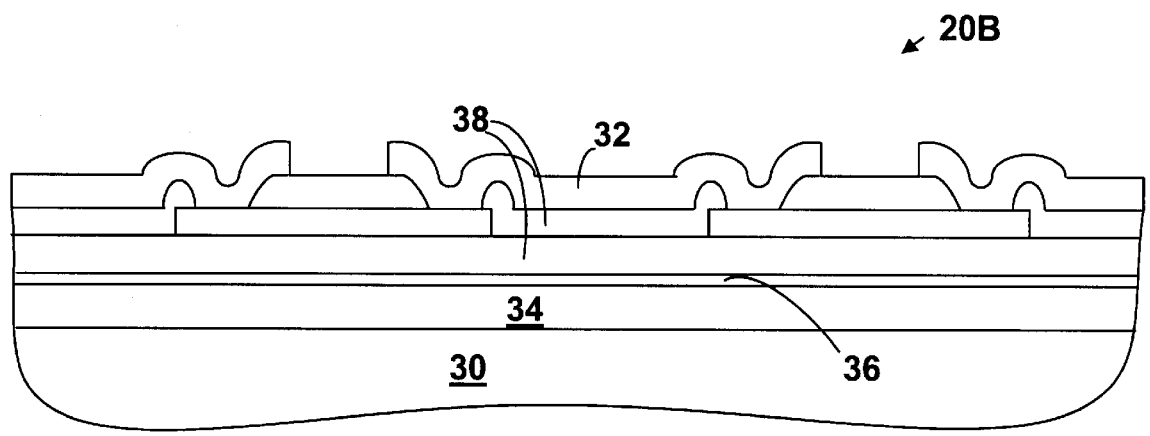
Figure 6:
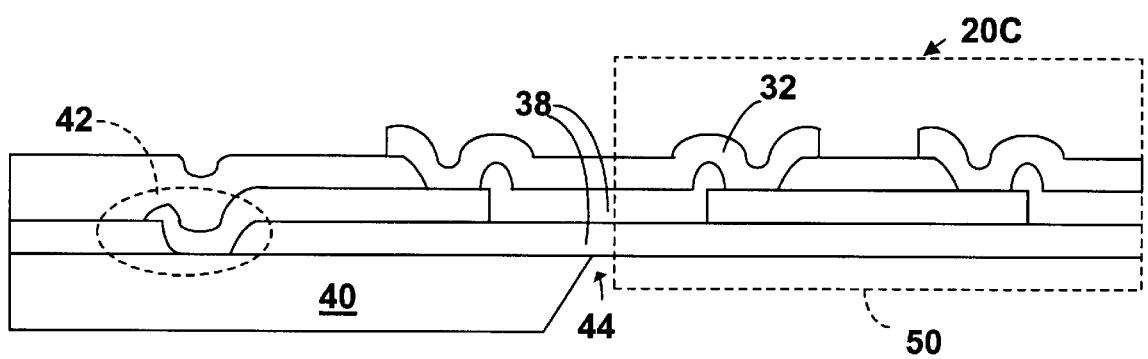
Figure 7:
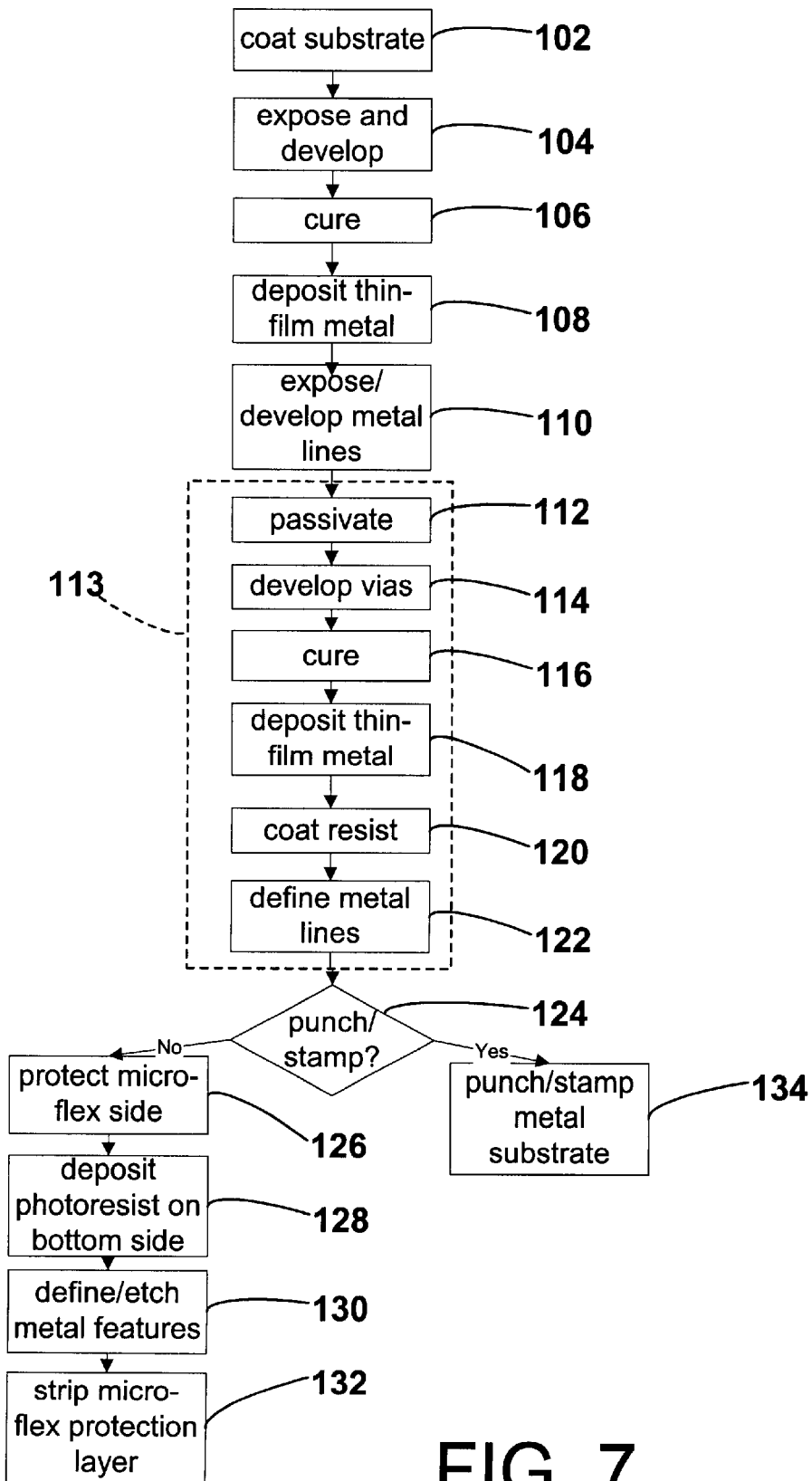
FIG. 7 is a flowchart illustrating a fabrication sequence of the twisted-wire pair of FIG. 6.

FIGS. 4–7 illustrate exemplary procedures in fabricating a microflex twisted-wire pair for semiconductor packaging, wherein FIG. 7 is a flowchart depicting the process of fabricating FIG. 6.

In FIG. 4, metal lines 22 and 26 are plated onto a kapton carrier 28 and an inter-layer connection is made using plated thru-holes 24. The resulting flexible, thin-film wire 20A is similar to the microflex thin-film wire 10 of FIG. 3, except that thin-film wire 20A is generally larger than the microflex thin-film wire 10 and will thus differ from microflex thin-film wire 10 in electrical characteristics and wiring ground rules.

FIG. 5 illustrates a cross-section of a microflex twisted-wire pair 20B just prior to release from silicon wafer carrier 30. The twisted-wire pair 20B comprises dielectric layers 32, passivation layers 38, barrier layer 36, release layer 34, and silicon wafer carrier 30. The resulting twisted-wire pair is a free-standing microflex wire.

FIG. 6 illustrates an example of fabricating a microflex twisted-wire pair 20C, or other microflex connectors (hereinafter referred to as microflex), wherein the microflex may be in contact, both mechanically and electrically, to a dielectric or other substrate (e.g., an outer lead in a leadframe) via substrate connection 42 and may also comprise a free-standing microflex 50. The free-standing microflex 50 is formed by etching away 44 substrate 40. The free-standing microflex 50 may then be mechanically coupled to the top surface of the chip through adhesives, lamination etc. and electrically coupled to the chip through connections such as wirebonding, solder ball (C4) connections, conductive epoxy, Au bumps, anisotropic conductive adhesive, transient liquid phase bonding, polymer-metal composite paste, thermal compression bonding etc. A microflex/leadframe structure, as discussed in reference to FIGS. 8–12 below may also be fabricated by mechanically and electrically coupling the microflex to the leadframe/microflex substrate. This coupling allows the utilization of standard plastic encapsulated packing tooling and processing.

FIG. 7 is a flowchart 100 illustrating a process by which a microflex/leadframe structure, such as one in FIG. 6, may be fabricated. The first step (step 102) includes coating a substrate (metal) sheet with a first thin-film dielectric layer, such as a photodefineable epoxy or polyimide. Then, the first thin-film dielectric layer is exposed and developed (step 104) to form vias for connection between the substrate and the microflex wiring (including twisted-wire pair wiring) and cleared areas and openings. If necessary, a cure is applied (step 106), and then a first thin-film metal is deposited (step 108). The thin-film metal is coated with photoresist (step 108) and the metal is exposed and developed (step 110) to create metal lines. A second thin-film dielectric layer, such as a passivation layer is then applied (step 112), vias are developed (step 114) and a cure is applied (step 116). A second thin-film metal layer is then deposited (step 118), and is coated with photoresist (step 120). Metal lines are then defined (step 122). If the substrate is to be punched/stamped (step 124=yes), then the leadframe structure is defined by punching the metal substrate (step 134). If the substrate is not to be punched/stamped (step 124=no) the microflex side of the microflex/leadframe structure is protected (step 126) and photoresist is deposited on the bottom side of the structure (step 128). The substrate (metal) features are then defined and etched (step 130) and the microflex protection layer is removed (step 132). The steps enclosed by box 113 may be repeated depending upon the layers of microflex desired.

An alternative to the fabrication process outlined above is to fabricate the microflex separate from the metal substrate (such as in FIG. 5). The free-standing microflex can then be mechanically and electrically coupled either to a patterned or unpatterned leadframe, or used in other applications, such as chip-scale packaging, and stacked-chip packaging as discussed below.

Figure 8:
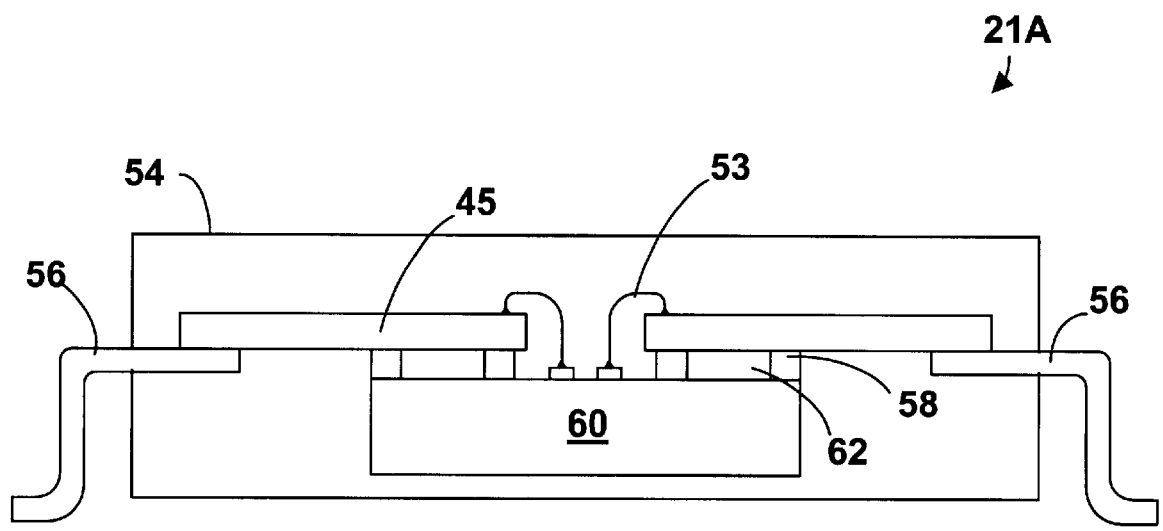
FIG. 8 is an exemplary package utilizing the thin-film microflex in accordance with a second embodiment of the present invention.

FIG. 8 illustrates a semiconductor package 21A wherein chip 60 is electrically connected to the outer lead 56 through microflex 45. Microflex 45 is fabricated with an opening which enables a wirebond connection 53 to connect to the I/O pads of chip 60. Chip 60, lead frame 56, microflex 45, and wirebond 53 assembly is encapsulated in plastic 54, forming semiconductor package 21A. Adhesive film 62 is placed between chip 60 and microflex 45.

Figure 9:
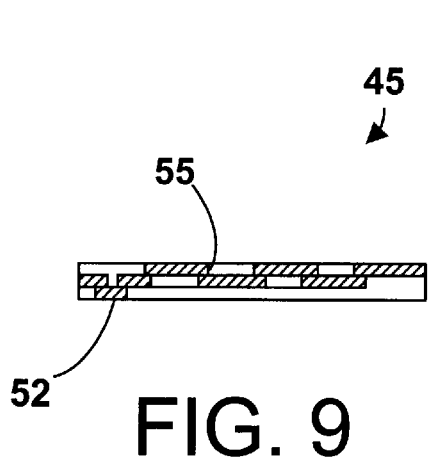
FIGS. 9, 10, 11, 12, and 13 are cross-sectional views showing exemplary embodiments of the thin-film microflex structures of FIG. 8.

FIGS. 9–13 illustrate exemplary microflex 45 that may be utilized in FIG. 8. As seen in FIG. 9, a microflex twisted-wire pair 55 is used to electrically connect chip 60 to outer lead 56. An electrical connection 52 connects microflex 55 to outer lead 56. As aforementioned, microflex twisted-wire pair 55 replaces the long inner leads in semiconductor leadframe packaging and thus reduces the inner-lead inductance.

Figure 10:
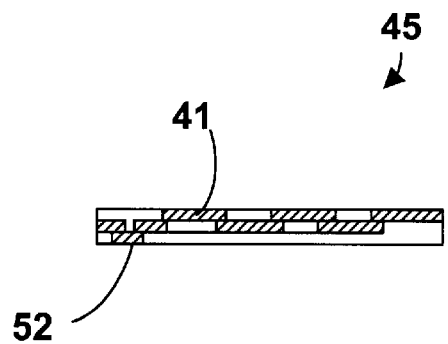

FIG. 10 illustrates a microflex connector 45 having an integrated resistor 41. Integrated resistor 41 is formed through the incorporation of a high resistance link 41 in the thin-film. This resistance link is used for enhanced electrical performance where circuit inductance is high. Thus, the input is dampened when there is too much inductance, allowing for a high performance system.

Figure 11:
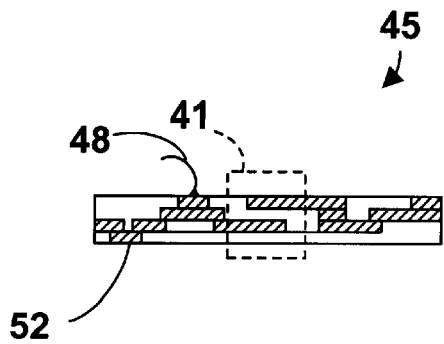

FIG. 11 illustrates a microflex connector 45 with an integrated capacitor 41 in parallel with the power supply, and located between power supply and ground. In this example, a three level thin-film capacitor (e.g., metal-polyimide-metal) is fabricated within microflex 45 providing excellent decoupling and high frequency performance. A wirebond 48 is shown, which couples the microflex to the chip 60 (FIG. 8). Capacitor 41 may also be created with two levels of metal.

Figure 12:
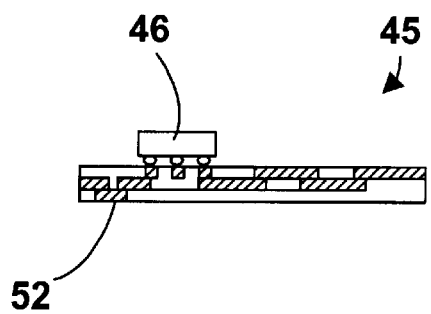

FIG. 12 shows a microflex connector 45 that allows for C4 connections with discrete devices, such as discrete device 46. Discrete device 46 may be connected to any portion of microflex connector 45, such as a middle portion. Thus, a discrete device may be electrically connected to chip 60 (FIG. 8) through microflex connector 45. The discrete device characteristics may include passive circuitry (e.g., capacitor, resistor, or diode) and/or active circuitry.

Figure 13:
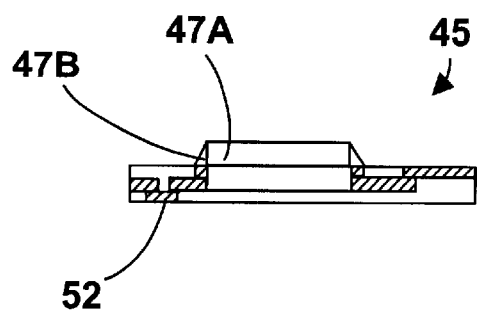

FIG. 13 shows a microflex connector 45 that allows for the connection of a discrete device 47A through a fillet interconnection 47B, typical of industry-standard surface mount technology (SMT). Again, the discrete device may be electrically connected to chip 60 (FIG. 8).

Although specific examples have been shown for FIGS. 9–13, it is to be understood that other thin-film microflex connectors may also be formed, such as a line and ground plane. Also, although in the following examples a twisted-wire pair is specifically shown for the microflex, it is to be understood that the microflex discussed in the previous figures may also be used. Besides the benefits discussed above with the various microflex connectors, the microflex technology of the present invention allows for transmission line impedances to match ($Z_0$output=$Z_0$load). Furthermore, the inductance is improved by a factor of ten times from a standard leadframe, and the ground bounce improves significantly (approximately 44%).

Figure 14:
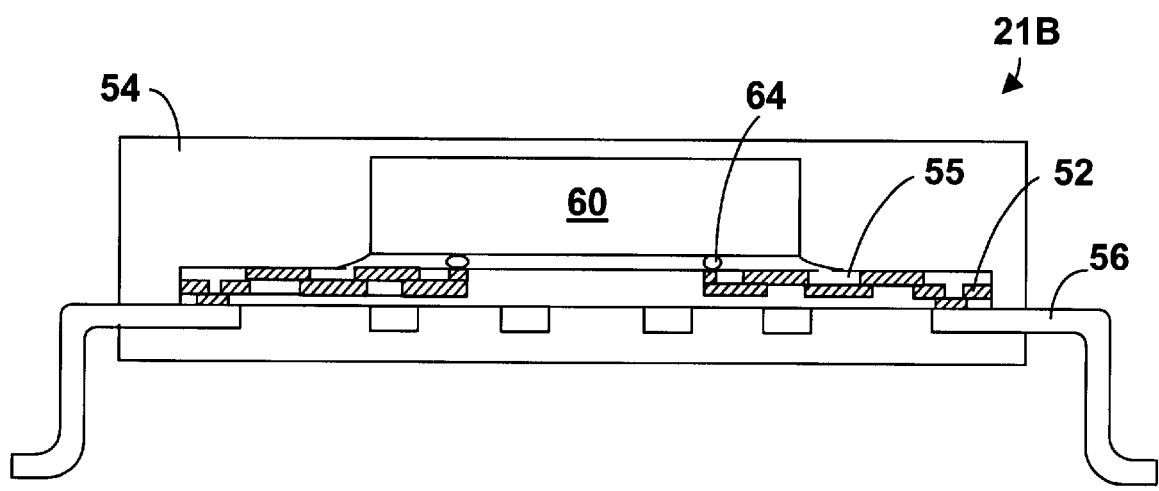
FIG. 14 is an exemplary package utilizing the twisted-wire pair of FIG. 6.

FIG. 14 illustrates a semiconductor package 21B wherein chip 60 is electrically connected to the outer lead 56 through microflex 55, which is similar to microflex 20C of FIG. 6. Microflex 55 is fabricated with an opening which enables a solder ball (C4) connection 64 to connect to the I/O pads of chip 60. An electrical connection 52 connects microflex 55 to outer lead 56. A plastic encapsulation 54 encloses semiconductor package 21B. As seen in FIG. 14 and subsequent figures, one of the many advantage of the present invention is the ability of utilizing C4 technology with leadframes and plastic encapsulation. This combination is possible because of the microflex technology of the present invention.

Figure 15:
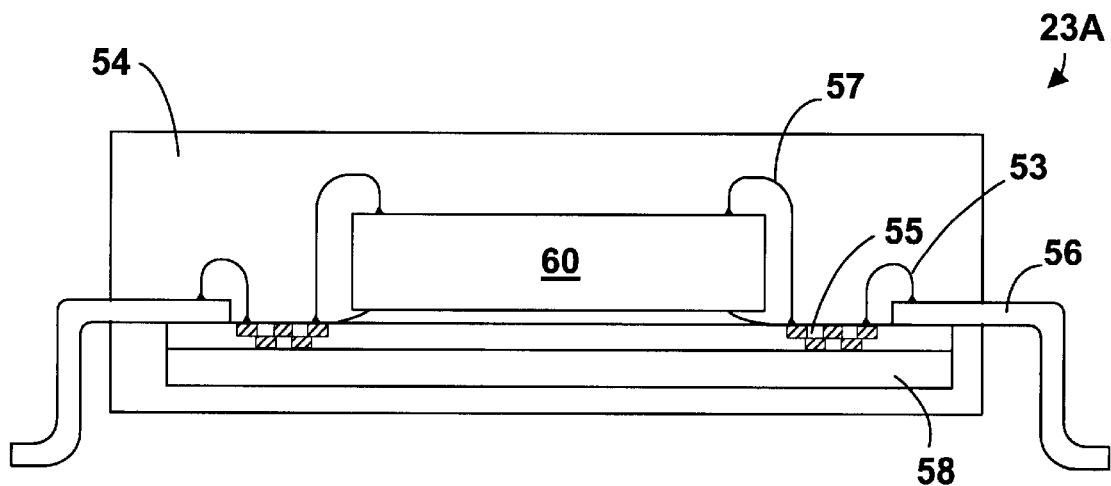
FIGS. 15 and 16 are exemplary packages utilizing the twisted-wire pair of FIG. 5.
Figure 16:
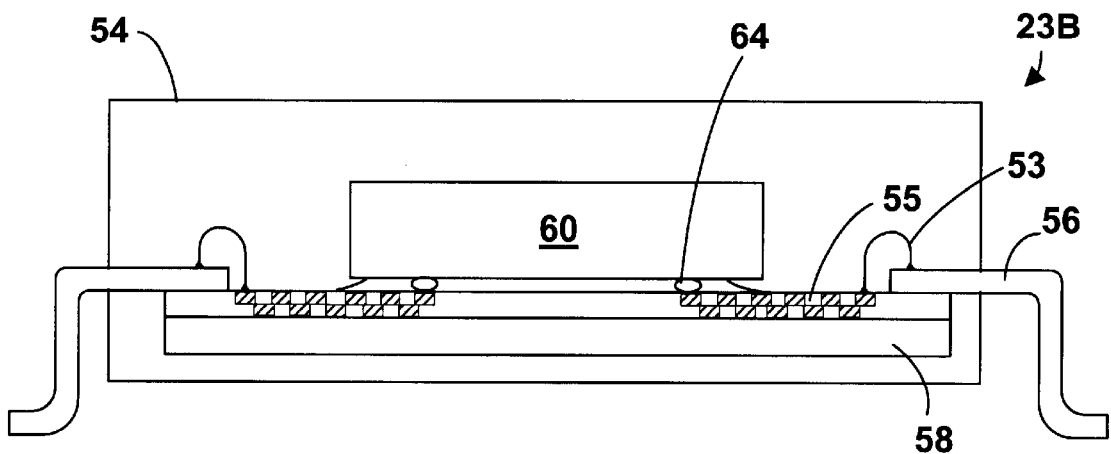

FIGS. 15 and 16 illustrate semiconductor packages 23A and 23B wherein microflex 55 is attached to (as a free-standing microflex such as in FIG. 5) or fabricated on a carrier/support 58. The outer leads 56 are electrically coupled to microflex 55 via wirebonding 53 and also mechanically coupled to microflex 55 and carrier/support 58. FIG. 15 shows a wirebond connection 57 electrically connecting chip 60 to microflex 55. FIG. 16 illustrates a solder ball connection 64 electrically connecting chip 60 to microflex 55.

Figure 17:
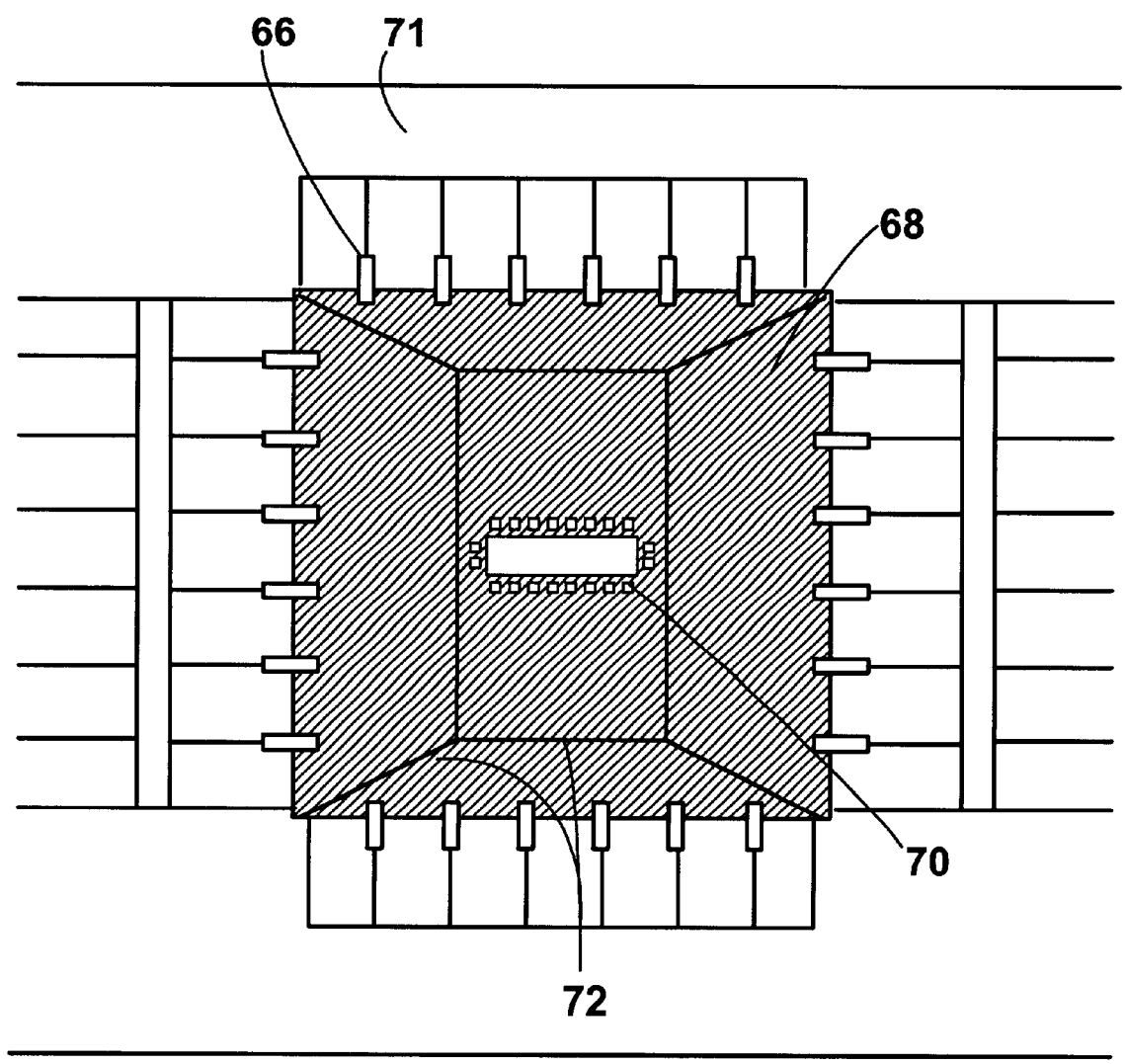
FIG. 17 is a plan view of a semiconductor leadframe package using the twisted-wire pair of FIG. 1 in accordance with an embodiment of the present invention.

FIG. 17 illustrates a top-down view of a semiconductor package similar to one depicted in FIG. 8. The microflex leadframe structure depicted in FIG. 17 is fabricated using the process outlined in FIG. 7, built on metal substrate 71. Cross-hatched region 68 is the microflex region, which contains microflex, such as twisted-wire pair, line/ground plane, microflex with a capacitor, etc. The leadframe support (element 58 of FIG. 8) is depicted by lines 72. Region 66 portrays the outer lead regions (containing outer lead 56 of FIG. 8). As aforementioned, the microflex electrically connects the package to leads 66. The package may be wirebonded to leads through a wirebond pad array 70.

Figure 18:
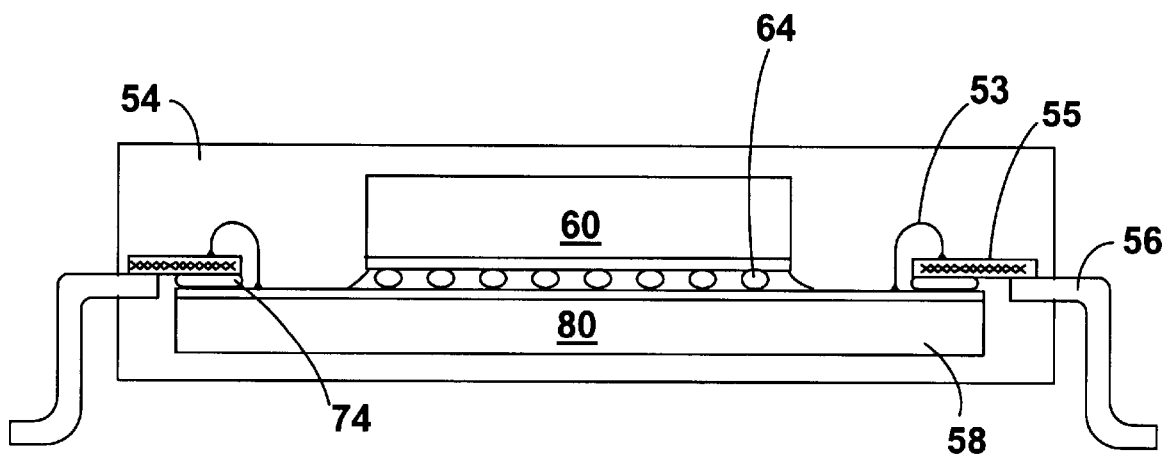
FIG. 18 is a cross-sectional view of a semiconductor package including two chips utilizing the twisted-wire pair of FIG. 6.

FIG. 18 illustrates combining chip-on-chip component technology (e.g., chip-on-chip component technology as disclosed in IBM patent disclosure BU9-97-063 referenced above) and microflex technology. As seen in FIG. 18, a first chip 60 connects to a second chip 80 through C4 connections 64. Although C4 connectors are specifically shown, other appropriate connectors may also be used to interconnect the chips, such as solder bumps, PMC paste, conductive epoxy, anisotropic conductive adhesive, etc. In this example, microflex 55 is electrically connected to chip 80 via wirebonding 53 and mechanically bonded to chip 80 via adhesive 74. Thus, microflex 55 provides electrical signals to/from outer lead 56 from/to both chip 80 and chip 60.

Figure 19:
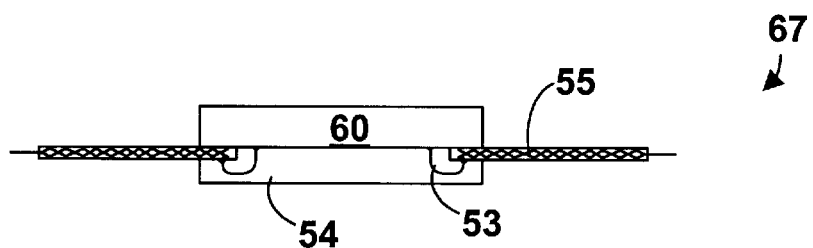
FIGS. 19 and 20 are cross-sectional views of exemplary semiconductor packages using the twisted-wire pair of FIG. 5 for connections to other devices.
Figure 21:
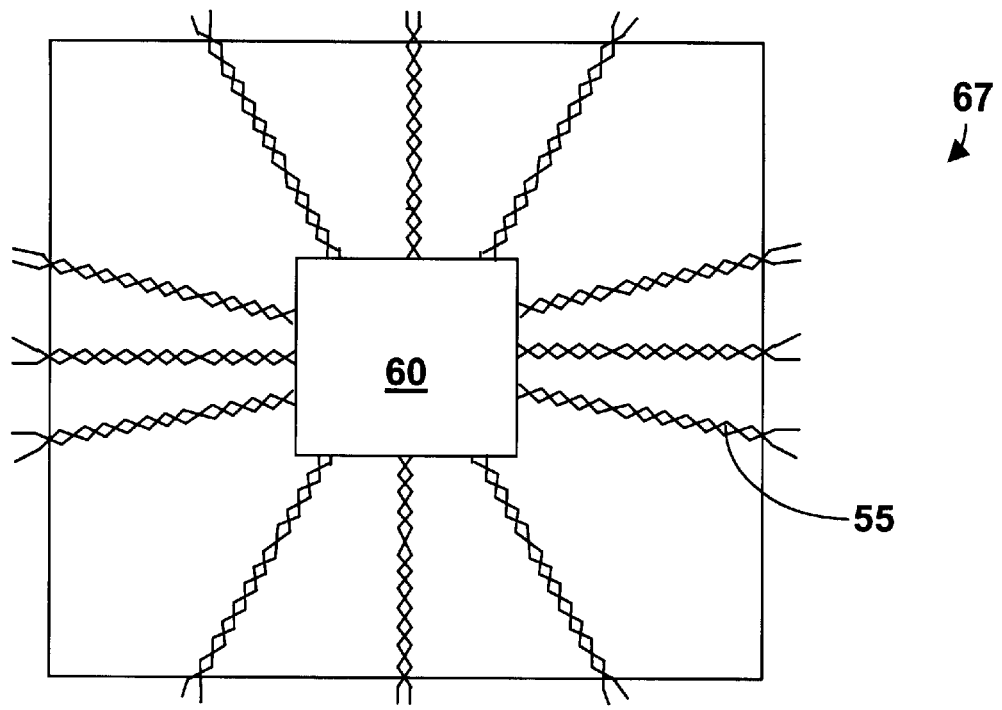
FIG. 21 is a plan view of FIG. 19.

FIG. 19 illustrates semiconductor package 67 comprising chip 60, microflex 55 and encapsulation 54. FIG. 21 illustrates the top-down view of semiconductor package 67 of FIG. 19. As seen in FIGS. 19 and 21, microflex 55 comprises bare metal outer leads and thus may also function as part of semiconductor package 67, enabling interconnection between chip 60 and the next level of assembly. In this example, the electrical and mechanical performance advantages of microflex technology, such as a reduction in lead inductance and reduction in package stresses, are realized and enhanced. In addition, thermal management problems are minimized through the enhanced electrical performance of the package and through chip 60, which being exposed in this package improves heat transfer.

Figure 20:
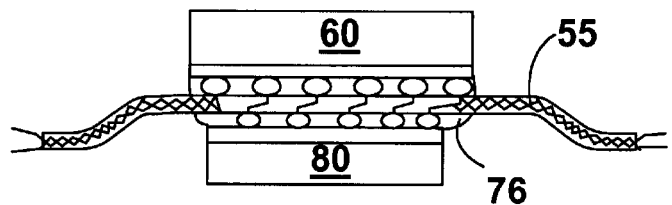
Figure 22:
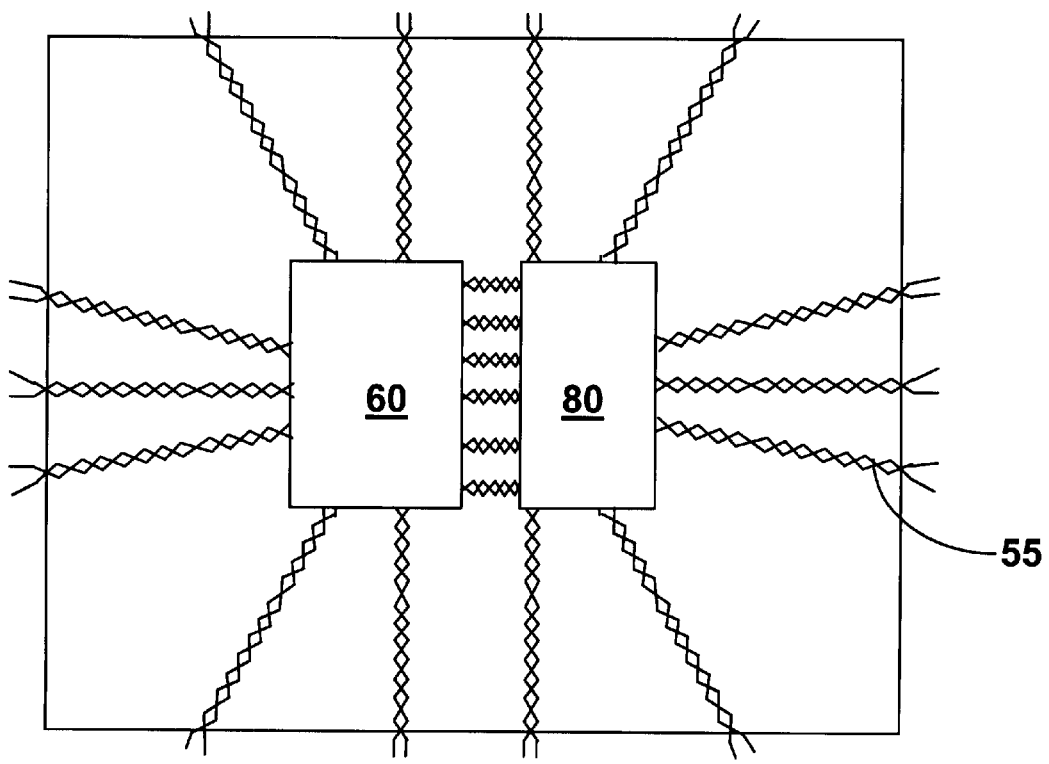
FIG. 22 is a plan view of two chips connected with the twisted-wire pair of FIG. 1.

As seen in FIGS. 20 and 22, two chips, chip 60 and chip 80, are interconnected and attached to microflex 55, forming a semiconductor package. Specifically, FIG. 20 illustrates the attachment of chips 60 and 80 to two sides of microflex 55 through C4 connectors. FIG. 22 is a top-down view of a generic semiconductor package comprising chips 60 and 80 interconnected with microflex 55, such as twisted-wire pair to reduce inductance.

Figure 23:
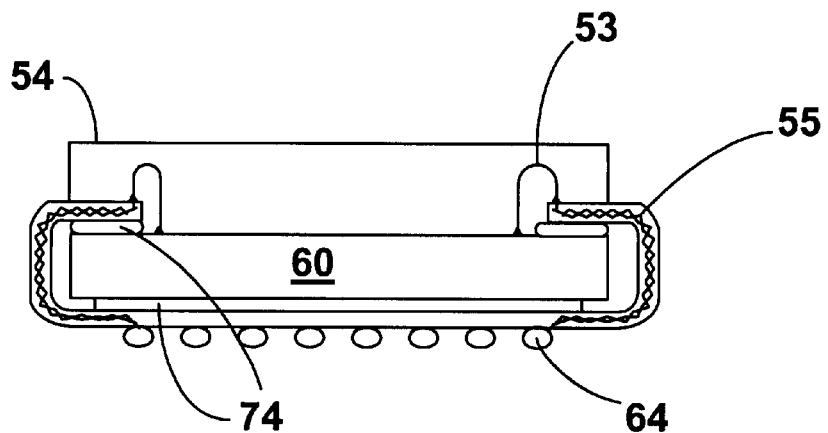
FIGS. 23, 24 and 25 are cross-sectional views of chip-scale packaging utilizing the twisted-wire pair of FIG. 5.
Figure 24:
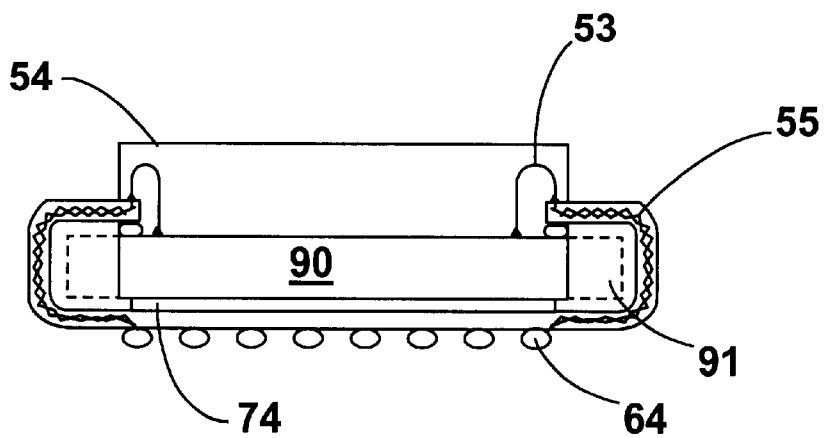
Figure 25:
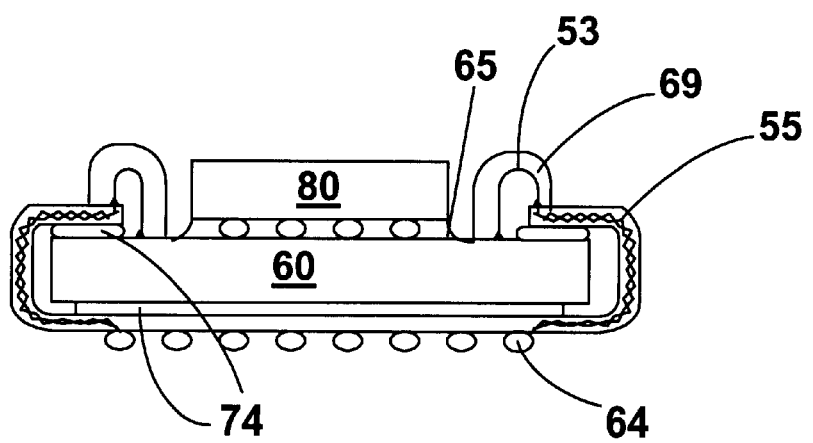

FIGS. 23–25 illustrate exemplary chip-scale packaging utilizing microflex technology. As seen in FIGS. 23–25, chip 60 (chip 90 in FIG. 24) is electrically connected to microflex 55 through wirebond 53, and is mechanically connected to microflex 55 through adhesive 74. An encapsulant 54 is used on the exposed side of chip 60. Microflex 55 wraps around chip 60 and provides a high electrical performance connection between chip 60 and the next level of packaging through electrical connectors 64 such as solder ball arrays. Adhesive 74 may be selected to achieve enhanced solder ball fatigue performance. For example, if a silicone-based adhesive is used, then the differential thermal expansion between chip 60 and the substrate (not shown) to which the chip-scale package is connected can be accommodated without the use of a solder ball encapsulant. This feature enables removal and replacement of the chip-scale packages, which is particularly important for chip-on-chip component applications wherein component removal and replacement is critical to achieving overall module yields. Solder balls also allow for a continuous contact to the chip I/O throughout an entire burn-in process. If the electrical connectors 64 happen to be wirebond connectors, the wirebond pads may easily be converted to solder balls, and visa versa.

As seen in FIG. 24, chip 90 may shrink 91 without affecting the electrical connectors 64. Thus, using microflex 55 in a chip-scale package provides a low-cost module since the entire package does not need to be redesigned to accommodate any shrinkage.

In FIG. 25, chip 80 is connected to chip 60, which is coupled to microflex 55. For this embodiment, a wirebond encapsulant 69 and solder ball encapsulant 65 protects the exposed sections of the chip assembly. One example of this embodiment is chip 80 being an SRAM and chip 60 being a microprocessor. Merging logic and memory chips can provide significantly enhanced electrical performance compared with current technology.

Figure 26:
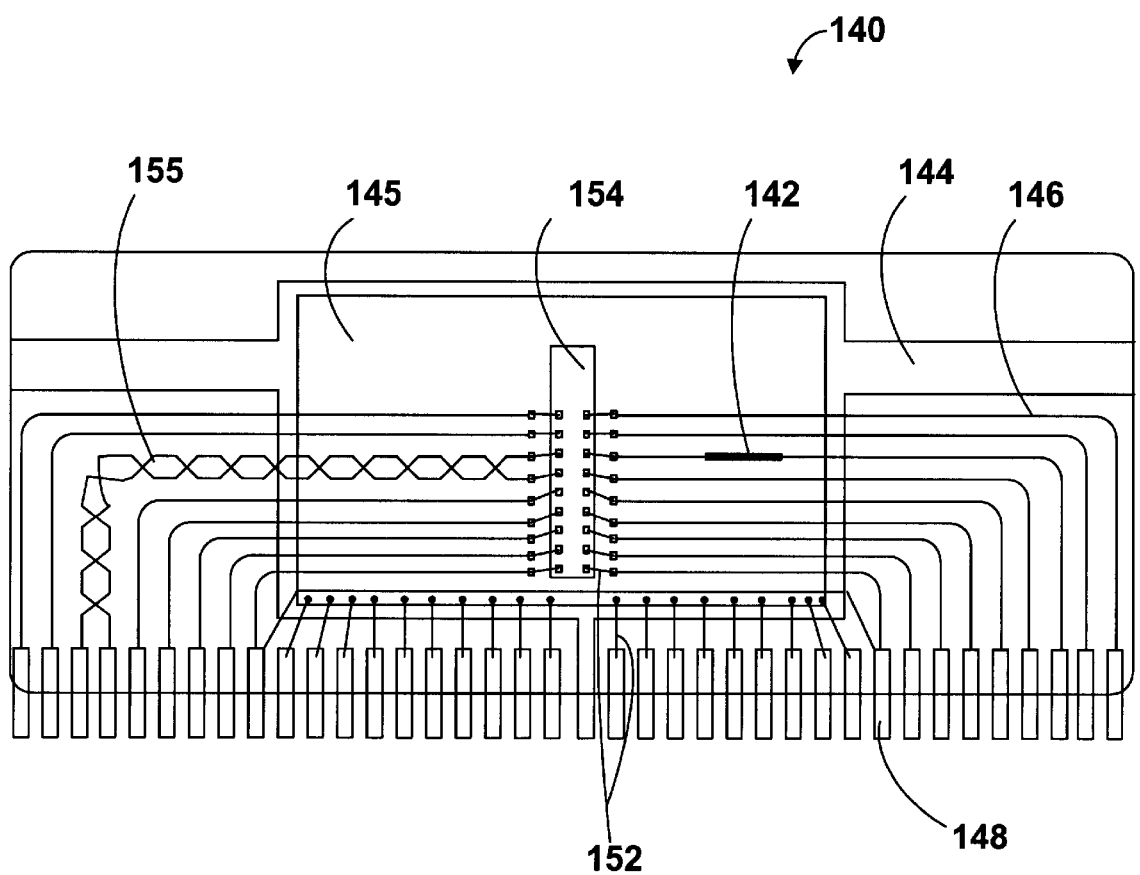
FIG. 26 is a plan view of a vertical leadframe package using the twisted-wire pair of FIG. 1 in accordance with an embodiment of the present invention.

A leadframe package 140 is shown in FIG. 26. A chip in package 140 may be wirebonded to leads 148 through wirebonds 152. Microflex 145 electrically connects the chip within package 140 to leads 148. An opening 154 in microflex 145 allows for wirebonding to the chip. Support structures 144 support microflex 145. In this example, three different microflex connectors are used: thin-film wiring 146, a twisted-wire pair 155 and microflex with a resistor 142.

Figure 27:
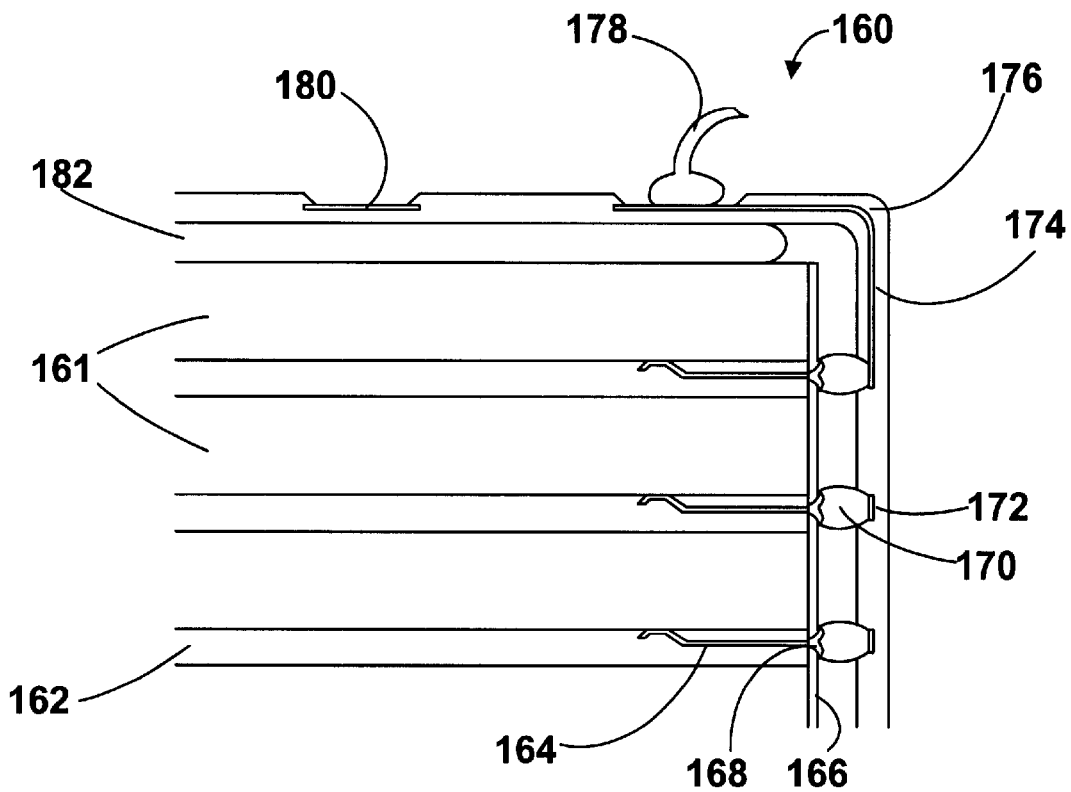
FIGS. 27 and 28 are cross-sectional views of stacked chip packaging utilizing the twisted-wire pair of FIG. 5.
Figure 28:
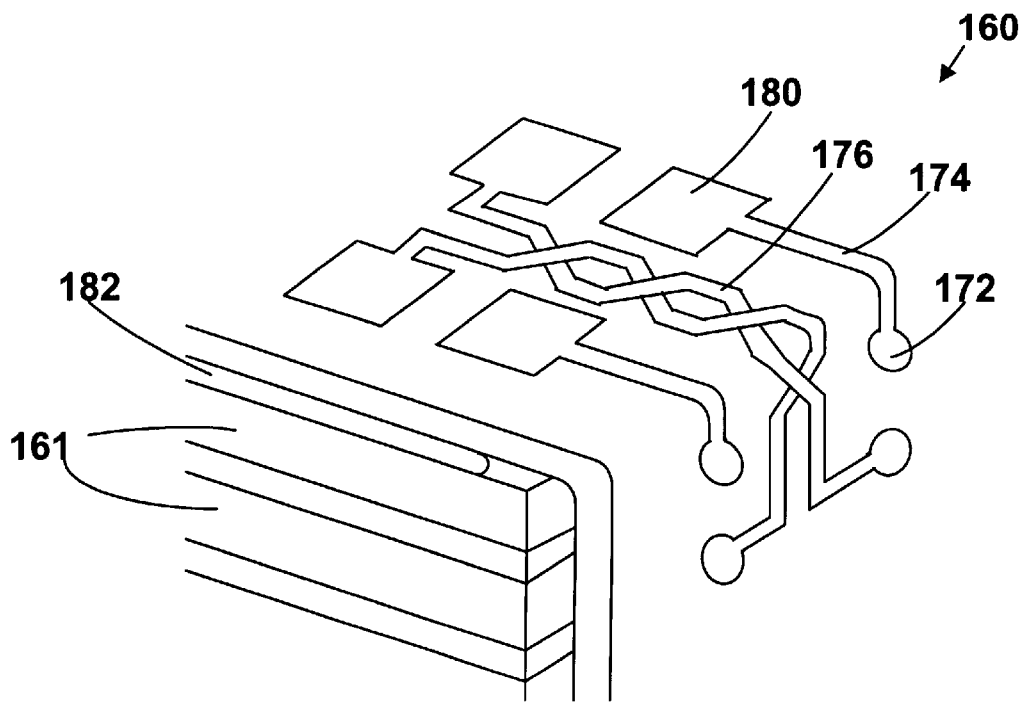

FIGS. 27 and 28 illustrate a stacked chip structure 160 that utilizes microflex 176 to allow for compaction and high performance of the stacked chips 161. As seen in FIG. 27, stacked chips 161 are separated by glue line 162, in which is inserted a transfer metal 164. The transfer metal 164 connects to a C4 solder ball 170 through C4 pad 168. A C4 pad 172 in microflex 176 allows for each chip 161 to connect to a bond pad 180, or wire bond 178 through thin-film wiring 174 in microflex and microflex 176. An adhesive 182 connects one face of chip 161 to microflex 176. FIG. 28 illustrates the microflex region comprising C4 pads 172, thin-film wiring 174, twisted-wire pair 176 and bond pad 180, which wrap around chips 161.

One of the key advantages of the microflex technology is that superior electrical performance (compared with currently available technologies) is possible. This superior electrical performance includes reduced line inductance, incorporation of integrated passive components, and attachment of discrete passive and active components to the microflex. All of these features enable operation of the chip at increased frequencies.

Thus, microflex technology according to the present invention allow for enhanced electrical, mechanical and thermal performance in semiconductor packages. Furthermore, microflex technology allows for personalization of chips and packages by providing various chip-to-microflex interconnection configurations, as seen from the embodiments and examples of the present invention, increasing the ability to offer customer-specific personalization at a low-cost.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A microflex thin film twisted-wire pair connector comprising:

a first thin-film metal wire having a first middle portion and a first end portion defined on a first thin-film layer;

a thin-film interconnection layer, wherein the thin film interconnection layer comprises at least one interconnection extending through the thin film interconnection layer; and a second thin-film metal wire having a second middle portion and a second end portion defined on a second thin-film metal layer, wherein said first middle portion of said first thin-film metal wire crosses over said second middle portion of said second thin-film metal wire and said first end portion is connected to said second end portion through the at least one interconnection extending through said thin-film interconnection layer.

2. The microflex thin film twisted-wire pair connector of claim 1, wherein the at least one interconnection is selected from the group consisting of a plated through hole and a stud.

* * * * *